United States Patent
Kim et al.

(10) Patent No.: US 10,685,160 B2
(45) Date of Patent: *Jun. 16, 2020

(54) LARGE CLUSTER PERSISTENCE DURING PLACEMENT OPTIMIZATION OF INTEGRATED CIRCUIT DESIGNS

(71) Applicant: International Business Machines Corporation, Armonk, NY (US)

(72) Inventors: Myung-Chul Kim, Austin, TX (US); Shyam Ramji, Langrangeville, NY (US); Paul G. Villarrubia, Austin, TX (US); Natarajan Viswanathan, Austin, TX (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/141,379

(22) Filed: Sep. 25, 2018

(65) Prior Publication Data

US 2019/0026418 A1 Jan. 24, 2019

Related U.S. Application Data

(63) Continuation of application No. 15/234,685, filed on Aug. 11, 2016, now Pat. No. 10,140,409, which is a
(Continued)

(51) Int. Cl.
G06F 30/392 (2020.01)
G06F 30/30 (2020.01)
(Continued)

(52) U.S. Cl.
CPC .......... *G06F 30/392* (2020.01); *G06F 30/30* (2020.01); *G06F 30/327* (2020.01); *G06F 30/33* (2020.01); *G06F 30/39* (2020.01)

(58) Field of Classification Search
CPC .......... G06F 17/5022; G06F 17/5045; G06F 17/505; G06F 17/5068; G06F 17/5072;
(Continued)

(56) References Cited

U.S. PATENT DOCUMENTS 4,630,219 A * 12/1986 DiGiacomo ........ G06F 17/5072
716/123
5,036,473 A * 7/1991 Butts .................. G06F 15/7867
703/16
(Continued)

OTHER PUBLICATIONS

List of IBM Patents or Patent Applications Treated As Related; Date Filed: Sep. 6, 2018, 2 pages.
(Continued)

*Primary Examiner* — Helen Rossoshek
(74) *Attorney, Agent, or Firm* — Cantor Colburn LLP; Margaret McNamara

(57) ABSTRACT

The disclosed herein relates to method for persistence during placement optimization of an integrated circuit design. The method comprises performing cluster operation by grouping of a plurality of cells into a plurality of mobs. The method further comprises performing a spreading operation by moving the plurality of mobs and the plurality of cells simultaneously to optimize empty space of the integrated circuit design.

18 Claims, 7 Drawing Sheets

Related U.S. Application Data continuation of application No. 15/010,013, filed on Jan. 29, 2016, now Pat. No. 9,495,501.

(51) Int. Cl.
| | |
|---|---|
| G06F 30/33 | (2020.01) |
| G06F 30/39 | (2020.01) |
| G06F 30/327 | (2020.01) |

(58) Field of Classification Search
CPC ...... G06F 30/392; G06F 30/327; G06F 30/39; G06F 30/33; G06F 30/30
See application file for complete search history.

(56) References Cited

U.S. PATENT DOCUMENTS

| | | | | |
|---|---|---|---|---|
| 5,224,056 A * | 6/1993 | Chene | G06F 17/5072 | 716/121 |
| 5,448,496 A * | 9/1995 | Butts | G06F 17/5027 | 716/116 |
| 5,566,078 A * | 10/1996 | Ding | G06F 17/5072 | 716/124 |
| 5,619,419 A * | 4/1997 | D'Haeseleer | G06F 17/5072 | 716/123 |
| 5,627,999 A * | 5/1997 | Cheng | G06F 17/5072 | 716/119 |
| 5,661,663 A * | 8/1997 | Scepanovic | G06F 17/5072 | 716/122 |
| 5,793,644 A * | 8/1998 | Koford | G06F 17/5072 | 706/13 |
| 5,903,461 A * | 5/1999 | Rostoker | G06F 17/5072 | 700/121 |
| 6,122,443 A * | 9/2000 | Nishikawa | G06F 17/5081 | 716/122 |
| 6,145,117 A * | 11/2000 | Eng | G06F 17/5045 | 716/105 |
| 6,155,725 A * | 12/2000 | Scepanovic | G06F 17/5072 | 709/213 |
| 6,440,780 B1 * | 8/2002 | Kimura | G06F 17/505 | 438/129 |
| 6,560,505 B1 * | 5/2003 | Kikuchi | G06F 17/5072 | 700/121 |
| 6,651,224 B1 * | 11/2003 | Sano | G06F 17/505 | 716/114 |
| 6,698,006 B1 * | 2/2004 | Srinivasan | G06F 1/10 | 716/114 |
| 6,789,232 B1 * | 9/2004 | Iyer | G06F 17/5068 | 716/103 |
| 6,951,003 B2 * | 9/2005 | Barbee | G06F 17/5072 | 716/122 |
| 7,076,755 B2 * | 7/2006 | Ren | G06F 17/5072 | 716/118 |
| 7,266,796 B1 * | 9/2007 | Chu | G06F 17/5072 | 716/123 |
| 7,549,137 B2 * | 6/2009 | Alpert | G06F 17/5072 | 716/114 |
| 7,624,366 B2 * | 11/2009 | Alpert | G06F 17/5072 | 716/119 |
| 7,882,475 B2 * | 2/2011 | Alpert | G06F 17/5072 | 716/119 |
| 8,010,926 B2 * | 8/2011 | Alpert | G06F 17/5077 | 716/120 |
| 8,219,957 B1 * | 7/2012 | Gaitonde | G06F 17/5072 | 716/119 |
| 8,230,377 B1 * | 7/2012 | Fang | G06F 17/5072 | 716/104 |
| 8,271,920 B2 * | 9/2012 | Cho | G06F 17/5068 | 716/104 |
| 8,302,057 B2 * | 10/2012 | Saika | G06F 17/5068 | 326/101 |
| 8,332,793 B2 * | 12/2012 | Bose | G06F 17/5068 | 716/108 |
| 8,413,085 B2 * | 4/2013 | Green | G06F 17/505 | 703/14 |
| 8,458,634 B2 * | 6/2013 | Alpert | G06F 17/5072 | 716/114 |
| 8,589,848 B2 * | 11/2013 | Alpert | G06F 17/5072 | 716/118 |
| 8,595,675 B1 | 11/2013 | Alpert et al. | | |
| 8,677,299 B1 * | 3/2014 | Alpert | G06F 17/5054 | 716/118 |
| 8,782,591 B1 * | 7/2014 | Ku | G06F 17/505 | 716/103 |
| 8,819,608 B2 | 8/2014 | McElvain et al. | | |
| 8,918,751 B1 * | 12/2014 | McCracken | G06F 17/5072 | 716/123 |
| 8,954,912 B2 * | 2/2015 | Alpert | G06F 17/5072 | 716/122 |
| 8,984,467 B2 * | 3/2015 | Arunachalam | G06F 17/5072 | 716/101 |
| 9,098,667 B1 * | 8/2015 | McCracken | G06F 17/5072 | |
| 9,135,375 B1 * | 9/2015 | Sood | G06F 17/50 | |
| 9,495,501 B1 | 11/2016 | Kim et al. | | |
| 2004/0015803 A1 * | 1/2004 | Huang | G01R 31/318591 | 716/103 |
| 2005/0183054 A1 * | 8/2005 | Wein | G06F 17/5072 | 716/105 |
| 2007/0157146 A1 * | 7/2007 | Chen | G06F 17/5072 | 257/798 |
| 2008/0066037 A1 * | 3/2008 | Alpert | G06F 17/5072 | 716/122 |
| 2008/0148203 A1 * | 6/2008 | Alpert | G06F 17/5072 | 716/114 |
| 2009/0193376 A1 * | 7/2009 | Alpert | G06F 17/5077 | 716/119 |
| 2012/0110532 A1 * | 5/2012 | Alpert | G06F 17/5072 | 716/114 |
| 2013/0047127 A1 * | 2/2013 | Arunachalam | G06F 17/5072 | 716/103 |
| 2013/0061195 A1 * | 3/2013 | Adya | G06F 17/5045 | 716/123 |
| 2013/0097573 A1 * | 4/2013 | Kim | G06F 17/5072 | 716/123 |
| 2013/0283225 A1 * | 10/2013 | Alpert | G06F 17/5072 | 716/122 |
| 2014/0149957 A1 * | 5/2014 | Alpert | G06F 17/5072 | 716/122 |
| 2015/0213159 A1 * | 7/2015 | Arunachalam | G06F 17/5072 | 716/103 |
| 2015/0220673 A1 * | 8/2015 | Choi | G06F 17/5054 | 716/102 |
| 2015/0370944 A1 * | 12/2015 | Wang | G06F 17/5068 | 716/132 |
| 2017/0220722 A1 | 8/2017 | Kim et al. | | |

OTHER PUBLICATIONS

Alpert et al.; "A Semi-Persistent Clustering Technique for VLSI Circuit Placement"; ISPD'05; Apr. 3-6, 2005; pp. 200-207.

Chan et al.; "Multilevel Generalized Force-Directed Method for Circuit Placement"; ISPD'05; Apr. 3-6, 2005; 8 Pages.

Chan et al; "Multilevel Optimization for Large-Scale Circuit Placement"; IEEE; Jul. 2000; 6 Pages.

Cong et al.; "Edge Separability-Based Circuit Clustering with Application to Multilevel Circuit Partitioning"; IEEE Transactions on Computer-Aided Design of Integrated Circuits and Systems; vol. 23, No. 3; Mar. 2004; pp. 346-357.

Hu et al.; "Fine Granularity Clustering-Based Placement"; IEEE Transactions on Computer-Aided Design of Integrated Circuits and Systems; vol. 23, No. 4; Apr. 2004; pp. 527-536.

\* cited by examiner

Process Flow 100

Example of Force-Directed Placement (QP + Spreading)
300

Iter 0

Iter 15

Iter 35

QP Solve    Spreading

LARGE CLUSTER PERSISTENCE DURING PLACEMENT OPTIMIZATION OF INTEGRATED CIRCUIT DESIGNS

DOMESTIC PRIORITY

This application is a continuation of U.S. application Ser. No. 15/234,685, filed Aug. 11, 2016, which is a continuation of U.S. application Ser. No. 15/010,013 (now U.S. Pat. No. 9,495,501), filed on Jan. 29, 2016, the disclosures of which are incorporated by reference herein in their entireties.

BACKGROUND

The disclosure relates generally to large cluster persistence during placement optimization of integrated circuit designs.

By virtue of technology constraints, a nature of a netlist, and/or a design-style, integrated circuit designs typically contain a large cluster or group of elements (logical hierarchies in standard-cells, IP blocks, etc.,) that share a certain characteristic. In contemporary implementations of circuit placements, compact placement of such large clusters during the physical implementation of the logical netlist is underemphasized or ignored due to the multi-objective (e.g., cell density, congestion, timing, etc.,) nature of circuit placement. In turn, contemporary implementations provide sub-optimal quality of results through inferior clustering itself and inferior handling of such large clusters during placement.

SUMMARY

According to one embodiment, a method for persistence during placement optimization of an integrated circuit design is provided. The method comprises performing cluster operation by grouping of a plurality of cells into a plurality of mobs. The method further comprises performing a spreading operation by moving the plurality of mobs and the plurality of cells simultaneously to optimize empty space of the integrated circuit design. According to other embodiments, the method can be implemented in a system or a computer program product.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter is particularly pointed out and distinctly claimed in the claims at the conclusion of the specification. The forgoing and other features, and advantages of the embodiments herein are apparent from the following detailed description taken in conjunction with the accompanying drawings in which:

DETAILED DESCRIPTION

In view of the above, embodiments disclosed herein may include a system, method, and/or computer program product (herein the system) that provides physical persistence of such large clusters, wherein the individual elements within a cluster are located in physical proximity to each other during multi-objective circuit placement. Physical persistence is a property of compact placement, where cells, elements, objects and/or variables are condensed and organized according to their values between runs of a placement optimization program.

The system utilizes a force-directed approach in the placement optimization program to implement physical persistence amongst a plurality of clusters during the physical implementation of a logical netlist, which does not rely on a priori physical constraints or large-scale circuit clustering during multi-objective circuit placement. In general, the force-directed approach enables the physical persistence of mobs during multi-objective circuit placement, without relying on a priori physical constraints and/or on large-scale circuit clustering. A logical netlist is a description of the connectivity of an integrated circuit design that includes a list of terminals ("pins") of the electronic components (e.g., cells, elements, objects, etc.) in the integrated circuit and a list of the electrical conductors that interconnect the terminals (e.g., a net is a conductor that interconnects two or more component terminals). By using this force-directed approach in the placement optimization program, the system can provide an improved quality of results (e.g., timing, congestion, etc.,), while optimizing other placement objectives (e.g., wire length, cell density, etc.).

Figure 1:
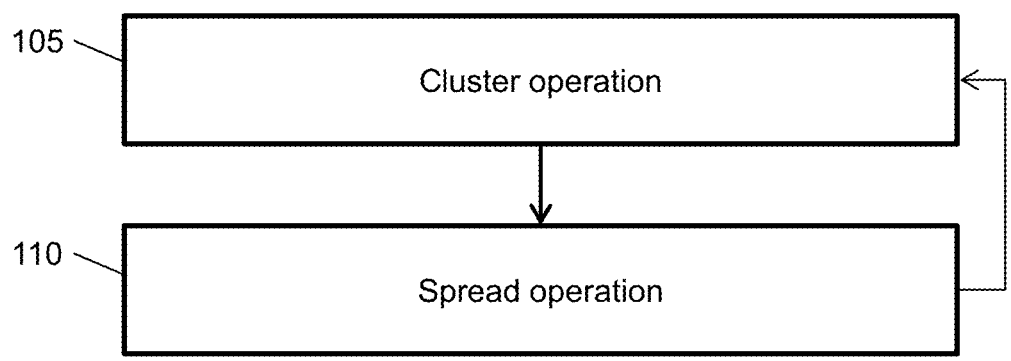
FIG. 1 illustrates a process flow for large cluster persistence during placement optimization of an integrated circuit design in accordance with an embodiment.

Turning now to FIG. 1, a process flow 100 for large cluster persistence during placement optimization of an integrated circuit design is generally shown in accordance with an embodiment. For instance, the process flow 100 illustrates an example operation by the system for the placement of large clusters or mobs (also referred to as a mob-mentality placement).

This example operation can be considered an execution of a placement optimization program utilizing a force-directed approach by the system. The placement optimization program is software that physically realizes the placement of the netlist, by placing all of the cells, terminals, gates, interconnects, etc. within the context of a printed circuit board based on design requirements (e.g., power, timing, etc.). To perform this placing, the placement optimization program can execute the process flow 100.

The process flow 100 begins at block 105, where the system performs a cluster operation. The cluster operation or clustering is a grouping of a plurality of cell sets in such a way that cells in the same group (e.g., cluster) are more similar (e.g., based on a predetermined characteristic) to each other than to cells in other groups (e.g., subsequent clusters).

A mob is a (large) cluster/group of elements or cells that share a certain characteristic. Examples of characteristics shared by a mob include, but are not limited to, closely connected in the netlist, share the same name hierarchy, belong to the same clock domain, part of a cell, now flattened within a cell cluster, and defined by the user to satisfy a particular design constraint.

At block 110, the system performs a spread operation. The spread operation or spreading is a movement of a plurality of cells or clusters in such a way that the cells or clusters occupy empty space adjacent to the cells or clusters. For instance, the system can move the mobs and the cells within the mobs simultaneously to optimize empty space of the integrated circuit design. In an embodiment, a tri-force method for force-directed placement can be utilized to perform the spreading operation. The tri-forces can include a spreading force, mob center of gravity (COG) force, and a mob COG direction force.

The process flow 100 further can loop through the cluster operation of block 105 and the spread operation of block 110 until the placement optimization of an integrated circuit design is complete. The placement optimization of the process flow 100, by clustering and spreading, minimizing a wire lengths, optimizing timing, optimizing routing conditions etc. The placement optimization of the process flow 100, by clustering and spreading, also guarantees space between the cells for the routing and other fabrication process of the integrated circuit design.

In view of the above, an example of the placement optimization of the above process flow 100 will now be described. For example, the system can perform a placement according to a hierarchal design methodology due to a size and complexity of an integrated circuit. That it, the system execute synthesizes a first block of a first level of the integrated circuit to arrange elements of the first block. Then, the system serially synthesizes each subsequent block of the first level until all of the elements of the first level have been arranged. Next, the system places the synthesized blocks of the first level together and moves to a second level, where the second level is above the first level on the hierarchal design. The system then synthesizes a first block of the second level to arrange elements of this block. Then, the system serially synthesizes each subsequent block of the second level until all of the elements of the first level have been arranged. This synthetization of each level of the hierarchal design is performed until all levels are complete.

Further, instead of serially synthetizing each block at each level, the system can treat each block of the first level as a mob. In turn, all mobs of the first level can be simultaneously and optimally placed through the execution of multiple iterations of the process flow 100. Once a full optimization is complete on the first level, the system can move to a next level and again simultaneously and optimally place the mobs of the next level through the execution of multiple iterations of the process flow 100. The system performs the placement optimization on each level of the hierarchal design until all levels are complete. Note that the placement optimization of the system according to the process flow 100 both optimizes the placement of the elements of the mob along with optimizes the placement of the mobs themselves (e.g., the system performs a two level optimization simultaneously). To further illustrate this notion, attention is directed to FIGS. 2-6.

Figure 2:
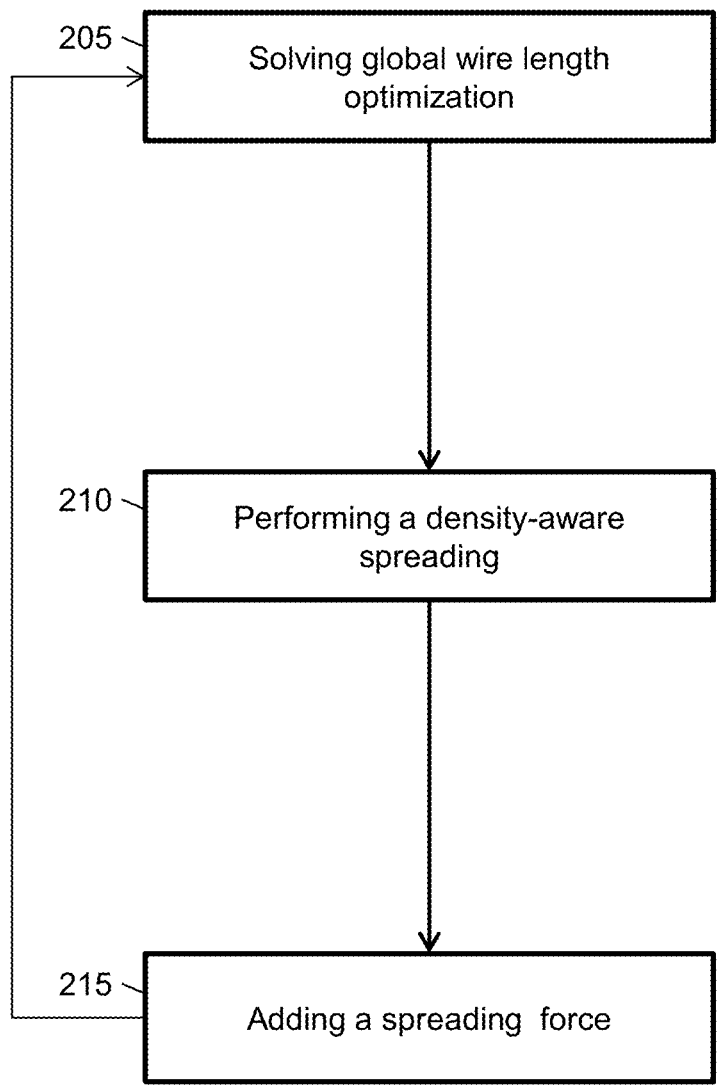
FIG. 2 illustrates a process flow for a force-directed placement optimization of integrated circuit design in accordance with an embodiment.

FIG. 2 illustrates a process flow 200 for a force-directed placement optimization of integrated circuit design in accordance with an embodiment. The process flow 200 begins at block 205, where the system solves a global wire length optimization. For example, the global wire length optimization can be solving of a quadratic programing (QP; also referred to as a QP solve) for a block identified from a netlist.

At block 210, the system performs a density-aware spreading for the block. That is the system locally spread the cells of the block. The density-aware spreading can determine fixed-point locations for a spreading force addition. At block 215, the system adds the spreading force for the next global wire length optimization (e.g., the next QP solve of the next block).

Figure 3:
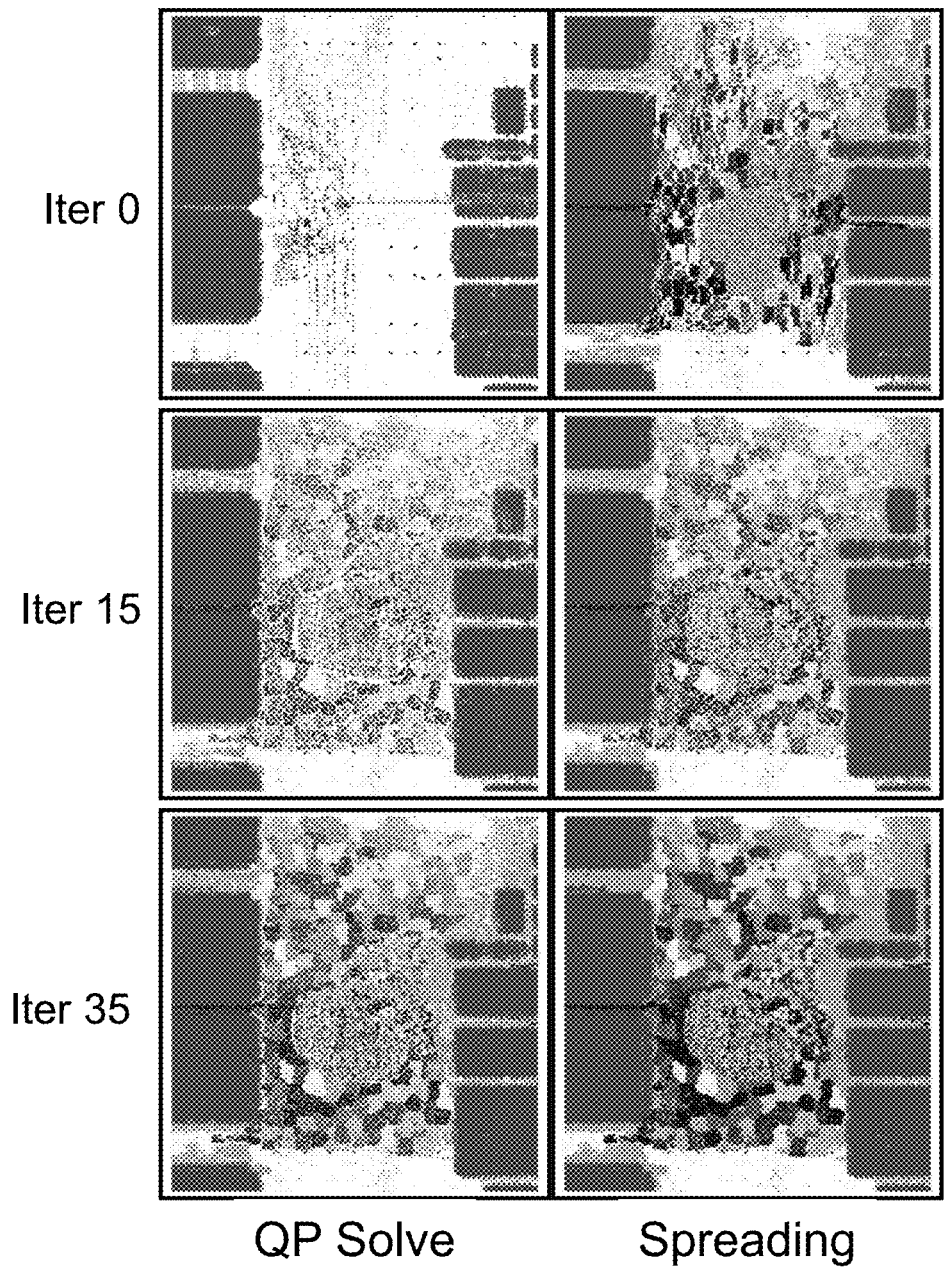
FIG. 3 illustrates an example of a force-directed placement of integrated circuit design in accordance with an embodiment.

FIG. 3 illustrates an example of a force-directed placement of integrated circuit design 300 in accordance with the process flow 200. Further, FIG. 3 shows three frame pairs corresponding to a first iteration ('Iter 0') of the process flow 200, a sixteenth iteration ('Iter 15') of the process flow 200, and a thirty-sixth iteration ('Iter 35') of the process flow 200. Of each pair, a left frame corresponds to the arrangement of the blocks and cells after a QP solve of block 205, while a right frame corresponds to the arrangement of the blocks and cells after a spreading of block 210. Note the pixilation between the shades (each shade cells that belong to the same name hierarchy), which illustrate that objects in same name hierarchy are not placed in physical proximity.

Figure 4:
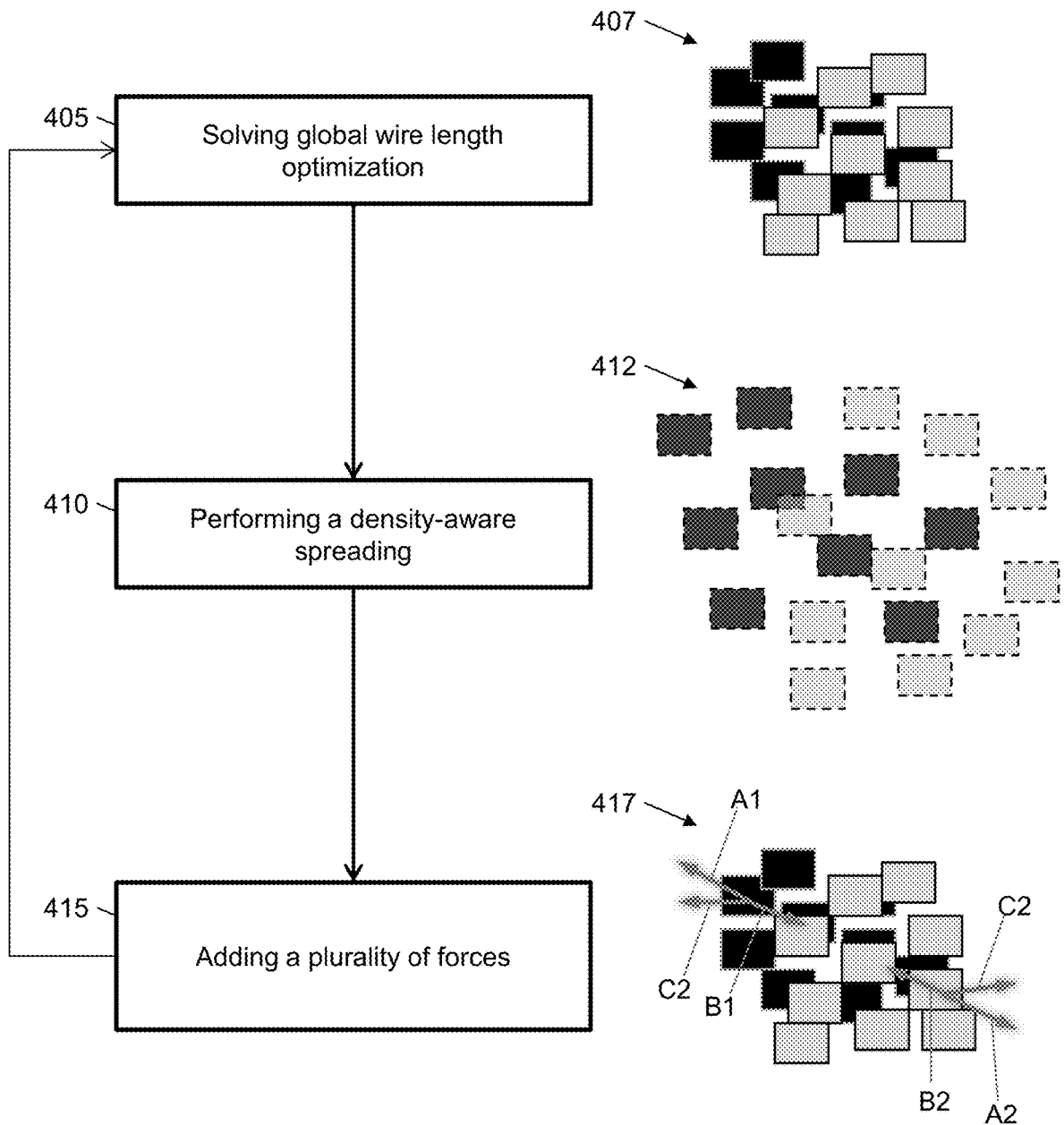
FIG. 4 illustrates a process flow for a mob-mentality force-directed placement optimization of integrated circuit design in accordance with an embodiment.

FIG. 4 illustrates a process flow 400 for a mob-mentality force-directed placement optimization of integrated circuit design in accordance with an embodiment. The process flow 400 begins at block 405, where the system solves a global wire length optimization. For example, the system performs a QP Solve. As illustrated in diagram 407, two mobs are optimized via the QP solve, where a first mob is indicated by black squares and a second mob is indicated by grey squares.

At block 410, the system performs a density-aware spreading for each of the two mobs. As illustrated in diagram 412, two mobs are spread while accounting for a density of the integrated circuit design. The density-aware spreading can determine fixed-point locations within each of the mobs for a spreading force addition.

At block 415, the system adds a plurality of forces for the next global wire length optimization (e.g., the next QP solve). For example, the plurality of forces can include a spreading force, a mob COG force, and a mob COG direction force. As shown in FIG. 4, arrows A1 and A2 represent the spreading force for the first and second mobs, respectively; arrows B1 and B2 represent the mob COG force for the first and second mobs, respectively; and arrows C1 and C2 represent the mob COG direction force for the first and second mobs, respectively.

The addition of forces at block 415 (and for each iteration of the process flow 400) can be performed with respect to Equations 1-5. Equation 1 is utilized to find a COG of the mob after the QP solve. Equation 2 is utilized to find a COG of the mob after density-aware spreading. Equations 3-5 are utilized to determine the direction of the forces for each mob (e.g., the spreading force, the mob COG Force, and the mob COG direction force). Then, for each mob element, the three forces are added based on sigmoid force weight scheduling. Also, the system can periodically measure mob compactness and add an additional COG force to further compact weak mobs.

$$MOB_{QP_{COG(x)}} = \Sigma_{i \in mob} QP(x_i)/\text{Num\_Mob\_Elements} \quad \text{Equation 1}$$

$$MOB_{QP_{COG(x)}} = \Sigma_{i \in mob} SP(x_i)/\text{Num\_Mob\_Elements} \quad \text{Equation 2}$$

$$QP(x_i) \rightarrow SP(x_i) \quad \text{Equation 3}$$

$$QP(x_i) \rightarrow MOB\_QP\_COG(x) \quad \text{Equation 4}$$

$$MOB\_QP\_COG(x) \rightarrow MOB\_SP\_COG(x) \quad \text{Equation 5}$$

Figure 5:
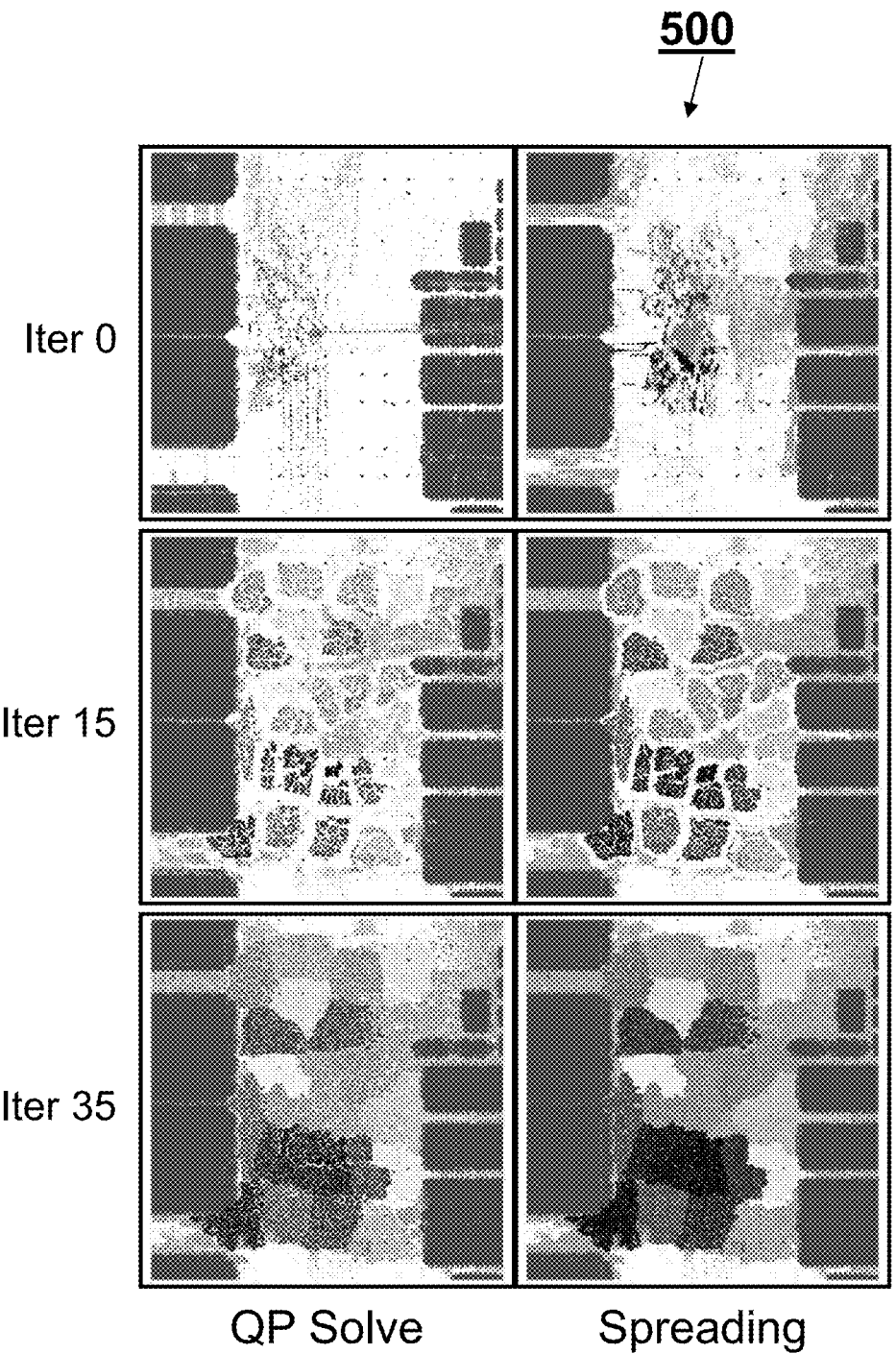
FIG. 5 illustrates an example of mob-mentality force-directed placement in accordance with an embodiment.

FIG. 5 illustrates an example of mob-mentality force-directed placement 500 in accordance with an embodiment. Further, FIG. 5 shows three frame pairs corresponding to a first iteration ('Iter 0') of the process flow 400, a sixteenth iteration ('Iter 15') of the process flow 400, and a thirty-sixth iteration ('Iter 35') of the process flow 400. Of each pair, a left frame corresponds to the arrangement of the blocks and cells after a QP solve of block 405, while a right frame corresponds to the arrangement of the blocks and cells after a spreading of block 410. Note the pixilation between the shades (each shade cells that belong to the same name hierarchy), which illustrate that objects in same name hierarchy are placed in physical proximity.

Further note that the process flow 400 can initially put more emphasis on bringing the mobs together and separating the elements of mobs directly, before gradually spreading the overall design. This is further described with respect to FIG. 6.

Figure 6:
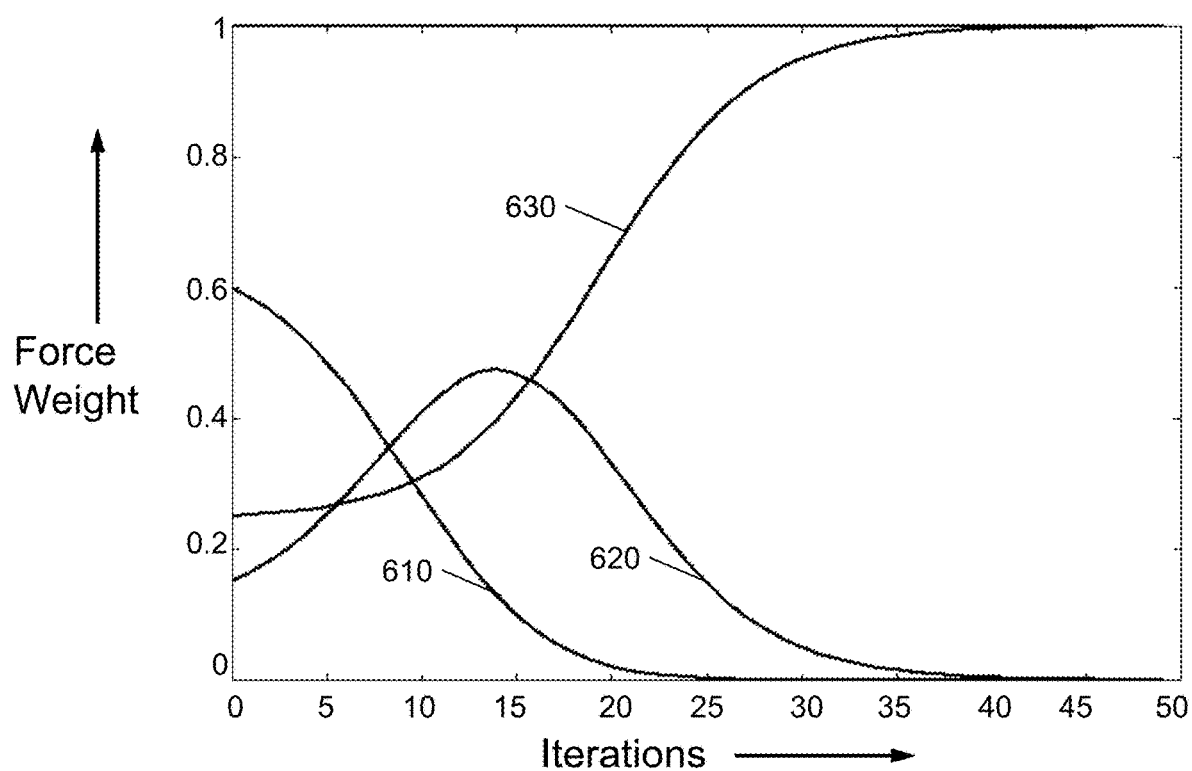
FIG. 6 illustrates a graph of sigmoid-based scheduling for three forces in accordance with an embodiment.

FIG. 6 illustrates a graph 600 of sigmoid-based scheduling for three forces in accordance with an embodiment. In general, the graph 600 shows a force scheduling to achieve compact mobs while spreading to meet density constraints. The graph 600 includes an X-axis indicating a number of iterations at a given time and a Y-access indicating a weight associated with a force. Line 610 is an object to mob COG force weight. Line 620 is a mob COG direction force weight. Line 630 is a density/spreading force weight. This two-level sigmoid scheduling approach by the system enables outer sigmoid control of a relative weight between spreading and mob forces and inner sigmoid control of a relative weight between the 'object to mob COG force' and the 'mob COG direction force.' In addition, the system can perform two-level sigmoid force weight scheduling to balance mob compactness and overall spreading, perform periodic measurement of mob compactness and mob-specific COG uplift force, and perform hierarchical mob-based placement (e.g., including generating and placing "super-mobs" and generating "sub-mobs" from super-mobs and place sub-mobs).

Figure 7:
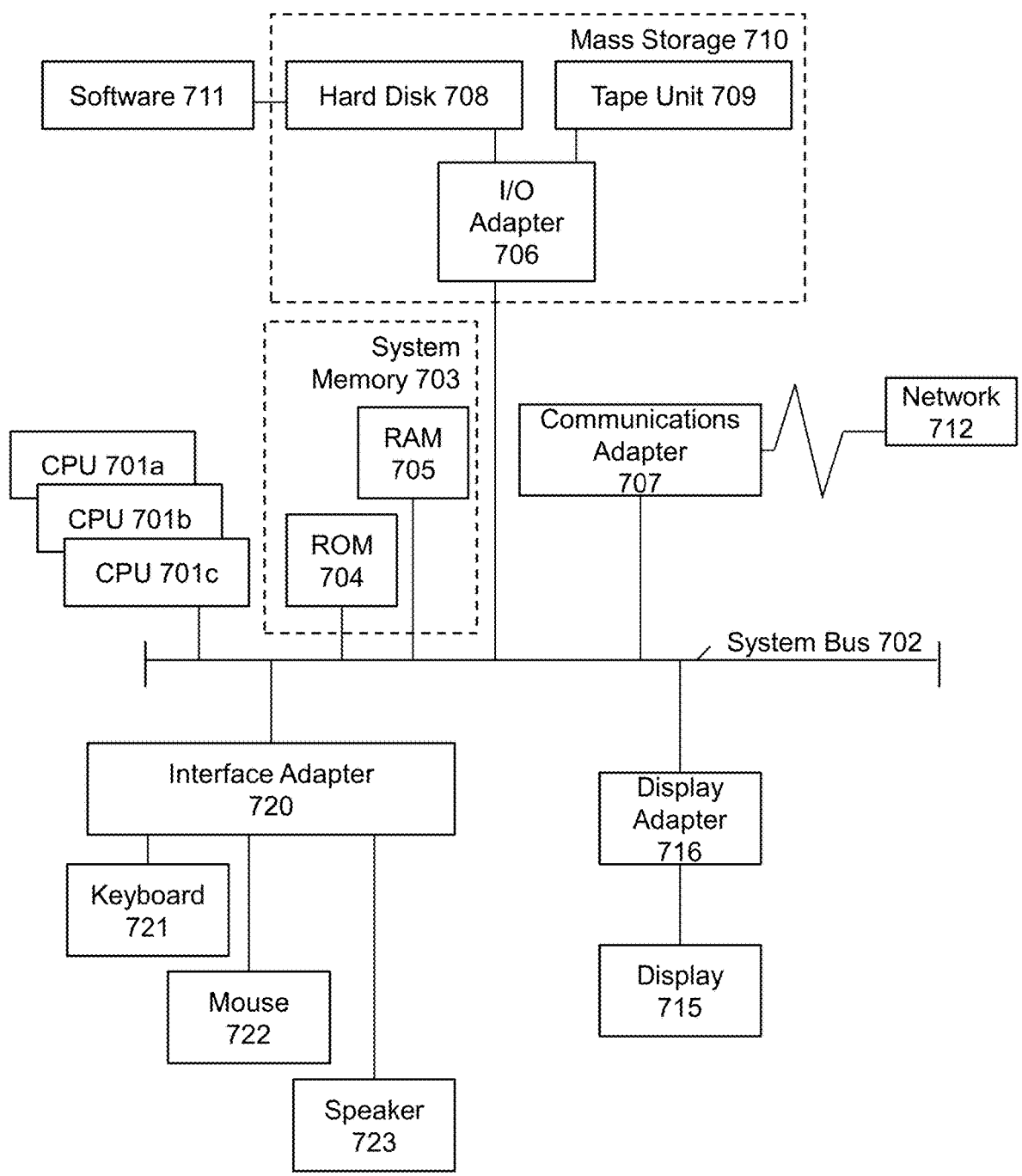
FIG. 7 illustrates a processing system in accordance with an embodiment.

Referring now to FIG. 7, there is shown an embodiment of a processing system 700 for implementing the teachings herein. In this embodiment, the processing system 700 has one or more central processing units (processors) 701a, 701b, 701c, etc. (collectively or generically referred to as processor(s) 701). The processors 701, also referred to as processing circuits, are coupled via a system bus 702 to system memory 703 and various other components. The system memory 703 can include read only memory (ROM) 704 and random access memory (RAM) 705. The ROM 704 is coupled to system bus 702 and may include a basic input/output system (BIOS), which controls certain basic functions of the processing system 700. RAM is read-write memory coupled to system bus 702 for use by processors 701.

FIG. 7 further depicts an input/output (I/O) adapter 706 and a network adapter 707 coupled to the system bus 702. I/O adapter 706 may be a small computer system interface (SCSI) adapter that communicates with a hard disk 708 and/or tape storage drive 709 or any other similar component. I/O adapter 706, hard disk 708, and tape storage drive 709 are collectively referred to herein as mass storage 710. Software 711 for execution on processing system 700 may be stored in mass storage 710. The mass storage 710 is an example of a tangible storage medium readable by the processors 701, where the software 711 is stored as instructions for execution by the processors 701 to perform a method, such as the process flows of the above FIGS. Network adapter 707 interconnects system bus 702 with an outside network 712 enabling processing system 700 to communicate with other such systems. A screen (e.g., a display monitor) 715 is connected to system bus 702 by display adapter 716, which may include a graphics controller to improve the performance of graphics intensive applications and a video controller. In one embodiment, adapters 706, 707, and 716 may be connected to one or more I/O buses that are connected to system bus 702 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 702 via an interface adapter 720 and the display adapter 716. A keyboard 721, mouse 722, and speaker 723 can be interconnected to system bus 702 via interface adapter 720, which may include, for example, a Super I/O chip integrating multiple device adapters into a single integrated circuit.

Thus, as configured in FIG. 7, processing system 705 includes processing capability in the form of processors 701, and, storage capability including system memory 703 and mass storage 710, input means such as keyboard 721 and mouse 722, and output capability including speaker 723 and display 715. In one embodiment, a portion of system memory 703 and mass storage 710 collectively store an operating system, such as the z/OS or AIX operating system from IBM Corporation, to coordinate the functions of the various components shown in FIG. 7.

Technical effects and benefits includes a multi-objective circuit placement of mobs that achieves high physical persistence (i.e., compact placement), improved quality of results (e.g., timing, congestion, etc.,) while optimizing other placement objectives (e.g., wire length, cell density, etc.). Thus, embodiments described herein are necessarily rooted in a processing system to perform proactive operations to overcome problems specifically arising in the realm of integrated circuit designs. Technical effects and benefits also include working with mobs of any size (e.g., large, medium, small, etc.); capable of handling large number of clusters; providing a seamless handling of mobbed vs. non-mobbed objects; providing an improved quality of results (e.g., allow a placer to decide mob locations); and capable of being applied to any force-directed/analytical placement approach.

The embodiments herein may include a system, a method, and/or a computer program product at any possible technical detail level of integration. The computer program product may include a computer readable storage medium (or media) having computer readable program instructions thereon for causing a processor to carry out aspects of the embodiments herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the embodiments herein may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the embodiments herein.

Aspects of the embodiments herein are described herein with reference to flowchart illustrations and/or block diagrams of methods, apparatus (systems), and computer program products according to embodiments herein. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments herein. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A processor-implemented method for persistence during placement optimization of an integrated circuit design, comprising:

performing, by a processor coupled to a memory, a spreading operation by moving a plurality of mobs and a plurality of cells of the plurality of mobs simultaneously to optimize empty space of the integrated circuit design, wherein the spreading operation achieves high physical persistence by:

identifying for each of the plurality of mobs a plurality of variables comprising a spreading force, a mob center of gravity force, and a mob center of gravity direction force, and adding for each of the plurality of mobs the spreading force, the mob center of gravity force, and the mob center of gravity direction force based on sigmoid force weight scheduling; and providing the integrated circuit design to a fabrication process to produce a physical circuit.

2. The processor-implemented method of claim 1, wherein the processor performs cluster operation by grouping of the plurality of cells into the plurality of mobs.

3. The processor-implemented method of claim 1, wherein each mob is a cluster of a portion of the plurality of cells that share a common characteristic.

4. The processor-implemented method of claim 3, wherein the common characteristic is a connection within netlist, a name hierarchy, or a clock domain.

5. The processor-implemented method of claim 1, comprising:

performing two-level sigmoid force weight scheduling to balance the high physical persistence of the plurality of mobs and overall spreading;

periodically measuring the high physical persistence and mob-specific center of gravity uplift force of the plurality of mobs; and performing hierarchical mob-based placement by generating and placing super-mobs and generating sub-mobs.

6. The processor-implemented method of claim 1, comprising:

periodically measuring the high physical persistence of the plurality of mobs; and adding an additional center of gravity force to further compact weak mobs of the plurality of mobs based on the measuring.

7. A computer program product, the computer program product comprising a computer readable storage medium having program instructions for persistence during placement optimization of an integrated circuit design embodied therewith, the program instructions executable by a processor to cause the processor to perform:

performing a spreading operation by moving a plurality of mobs and a plurality of cells of the plurality of mobs simultaneously to optimize empty space of the integrated circuit design, wherein the spreading operation achieves high physical persistence by:

identifying for each of the plurality of mobs a plurality of variables comprising a spreading force, a mob center of gravity force, and a mob center of gravity direction force, and adding for each of the plurality of mobs the spreading force, the mob center of gravity force, and the mob center of gravity direction force based on sigmoid force weight scheduling; and providing the integrated circuit design to a fabrication process to produce a physical circuit.

8. The computer program product of claim 7, wherein the processor performs cluster operation by grouping of the plurality of cells into the plurality of mobs.

9. The computer program product of claim 7, wherein each mob is a cluster of a portion of the plurality of cells that share a common characteristic.

10. The computer program product of claim 9, wherein the common characteristic is a connection within netlist, a name hierarchy, or a clock domain.

11. The computer program product of claim 7, the program instructions executable by a processor to cause the processor to perform:

performing two-level sigmoid force weight scheduling to balance the high physical persistence of the plurality of mobs and overall spreading;

periodically measuring the high physical persistence and mob-specific center of gravity uplift force of the plurality of mobs; and performing hierarchical mob-based placement by generating and placing super-mobs and generating sub-mobs.

12. The computer program product of claim 7, the program instructions executable by a processor to cause the processor to perform:

periodically measuring the high physical persistence of the plurality of mobs; and adding an additional center of gravity force to further compact weak mobs of the plurality of mobs based on the measuring.

13. A system, comprising a processor and a memory storing program instructions for persistence during placement optimization of an integrated circuit design embodied therewith, the program instructions executable by a processor to cause the system to perform:

performing a spreading operation by moving a plurality of mobs and a plurality of cells of the plurality of mobs simultaneously to optimize empty space of the integrated circuit design, wherein the spreading operation achieves high physical persistence by:

identifying for each of the plurality of mobs a plurality of variables comprising a spreading force, a mob center of gravity force, and a mob center of gravity direction force, and adding for each of the plurality of mobs the spreading force, the mob center of gravity force, and the mob center of gravity direction force based on sigmoid force weight scheduling; and providing the integrated circuit design to a fabrication process to produce a physical circuit.

14. The system of claim 13, wherein the processor performs cluster operation by grouping of the plurality of cells into the plurality of mobs.

15. The system of claim 13, wherein each mob is a cluster of a portion of the plurality of cells that share a common characteristic.

16. The system of claim 15, wherein the common characteristic is a connection within netlist, a name hierarchy, or a clock domain.

17. The system of claim 13, the program instructions executable by the processor to cause the system to perform:

performing two-level sigmoid force weight scheduling to balance the high physical persistence of the plurality of mobs and overall spreading;

periodically measuring the high physical persistence and mob-specific center of gravity uplift force of the plurality of mobs; and performing hierarchical mob-based placement by generating and placing super-mobs and generating sub-mobs.

18. The system of claim 13, the program instructions executable by the processor to cause the system to perform:
   periodically measuring the high physical persistence of the plurality of mobs; and
   adding an additional center of gravity force to further compact weak mobs of the plurality of mobs based on the measuring.

* * * * *